(12) United States Patent
Ramaswamy et al.

(10) Patent No.: US 7,989,329 B2
(45) Date of Patent: Aug. 2, 2011

(54) REMOVAL OF SURFACE DOPANTS FROM A SUBSTRATE

(75) Inventors: Kartik Ramaswamy, San Jose, CA (US); Kenneth S. Collins, San Jose, CA (US); Biagio Gallo, Palo Alto, CA (US); Hiroji Hanawa, Sunnyvale, CA (US); Majeed A. Foad, Sunnyvale, CA (US); Martin A. Hilkene, Gilroy, CA (US); Kartik Santhanam, Fremont, CA (US); Matthew D. Scotney-Castle, Morgan Hill, CA (US)

(73) Assignee: Applied Materials, Inc., Santa Clara, CA (US)

( * ) Notice: Subject to any disclaimer, the term of this patent is extended or adjusted under 35 U.S.C. 154(b) by 234 days.

(21) Appl. No.: 11/963,034

(22) Filed: Dec. 21, 2007

(65) Prior Publication Data

US 2009/0162996 A1 Jun. 25, 2009

(51) Int. Cl.
*H01L 21/38* (2006.01)

(52) U.S. Cl. ........ 438/559; 438/542; 438/557; 438/564; 438/568; 257/375; 257/486; 257/751; 257/E21.056; 257/E21.135

(58) Field of Classification Search .................. 438/542, 438/543, 549, 550, 554, 557, 559, 564, 565, 438/568; 257/375, 486, 787, 751, E21.056, 257/E21.135, E21.141–E21.142, E21.152–E21.153, 257/E21.144–E21.145

See application file for complete search history.

(56) References Cited

U.S. PATENT DOCUMENTS

| | | | |
|---|---|---|---|
| 4,668,304 A | 5/1987 | Schachameyer et al. | |
| 6,716,704 B2 | 4/2004 | Lee et al. | |
| 6,764,551 B2 | 7/2004 | Riggs et al. | |
| 6,794,277 B2 | 9/2004 | Machida et al. | |
| 6,984,552 B2 | 1/2006 | Machida et al. | |
| 7,064,399 B2 | 6/2006 | Babcock et al. | |

(Continued)

FOREIGN PATENT DOCUMENTS

FR 2 784 501 A1 4/2000

(Continued)

OTHER PUBLICATIONS

International Search Report and Written Opinion of the International Searching Authority mailed May 28, 2009 in PCT/US2008/087446.

*Primary Examiner* — Matthew Smith
*Assistant Examiner* — Su C Kim
(74) *Attorney, Agent, or Firm* — Patterson & Sheridan, L.L.P.

(57) ABSTRACT

A method and apparatus for removing excess dopant from a doped substrate is provided. In one embodiment, a substrate is doped by surfaced deposition of dopant followed by formation of a capping layer and thermal diffusion drive-in. A reactive etchant mixture is provided to the process chamber, with optional plasma, to etch away the capping layer and form volatile compounds by reacting with excess dopant. In another embodiment, a substrate is doped by energetic implantation of dopant. A reactive gas mixture is provided to the process chamber, with optional plasma, to remove excess dopant adsorbed on the surface and high-concentration dopant near the surface by reacting with the dopant to form volatile compounds. The reactive gas mixture may be provided during thermal treatment, or it may be provided before or after at temperatures different from the thermal treatment temperature. The volatile compounds are removed. Substrates so treated do not form toxic compounds when stored or transported outside process equipment.

12 Claims, 6 Drawing Sheets

U.S. PATENT DOCUMENTS

| | | |
|---|---|---|
| 7,090,890 B1 | 8/2006 | Sturm et al. |
| 7,235,492 B2 | 6/2007 | Samoilov |
| 2001/0001729 A1 | 5/2001 | Leverd et al. |
| 2001/0004545 A1 | 6/2001 | Drobny et al. |
| 2003/0067037 A1 | 4/2003 | Lu et al. |
| 2004/0072446 A1 | 4/2004 | Liu et al. |
| 2004/0194813 A1 | 10/2004 | Riggs et al. |
| 2005/0115504 A1* | 6/2005 | Ueda et al. ............ 118/723 R |
| 2006/0019477 A1* | 1/2006 | Hanawa et al. ............ 438/514 |
| 2006/0027810 A1 | 2/2006 | Machida et al. |
| 2006/0073683 A1 | 4/2006 | Collins et al. |
| 2006/0226480 A1 | 10/2006 | Furukawa et al. |
| 2007/0123051 A1 | 5/2007 | Arghavani et al. |
| 2007/0243700 A1* | 10/2007 | Qin et al. ............ 438/513 |

FOREIGN PATENT DOCUMENTS

| | | |
|---|---|---|
| JP | 01 112732 | 5/1989 |
| KR | 10 2005 0113423 | 12/2005 |

* cited by examiner

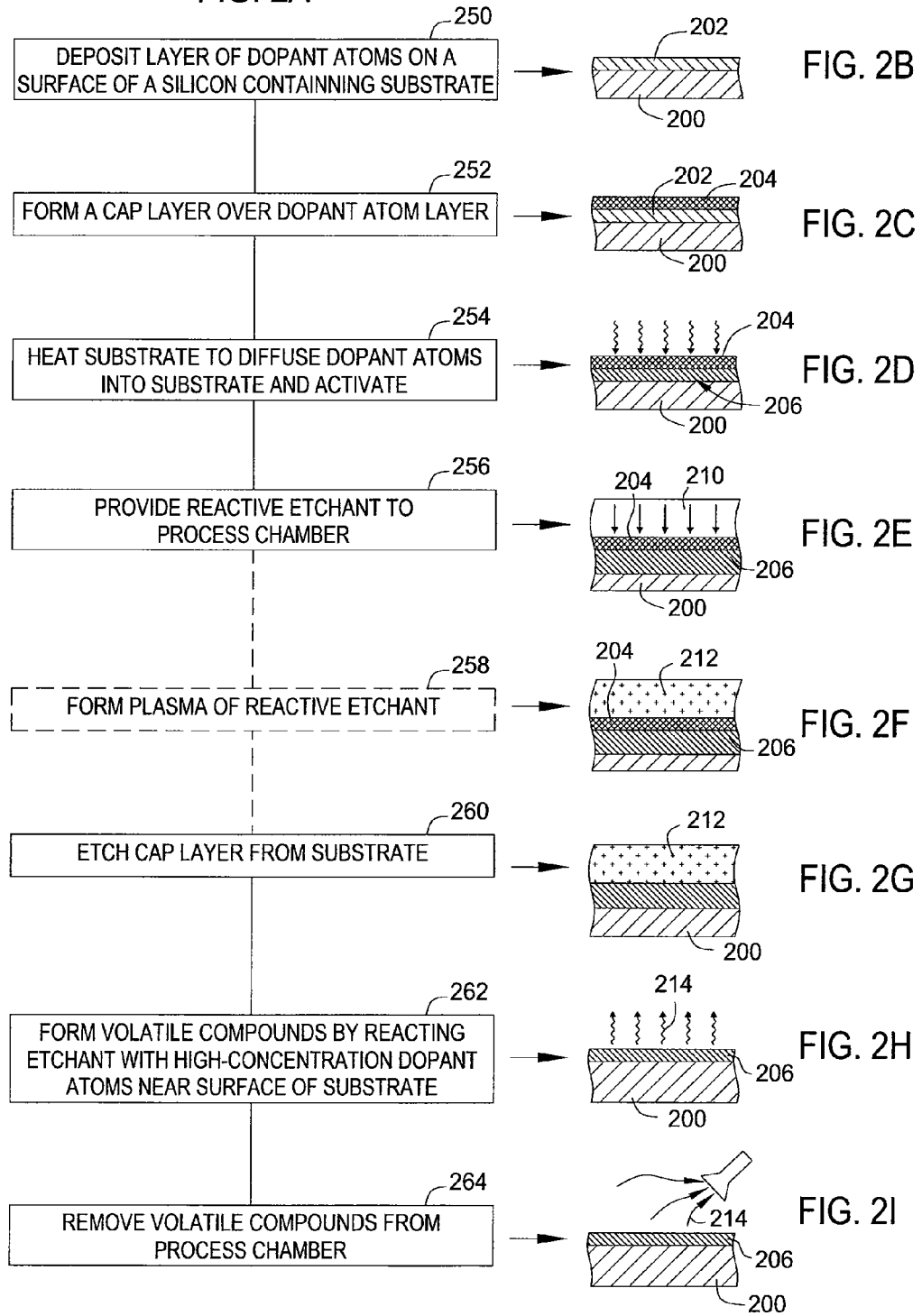

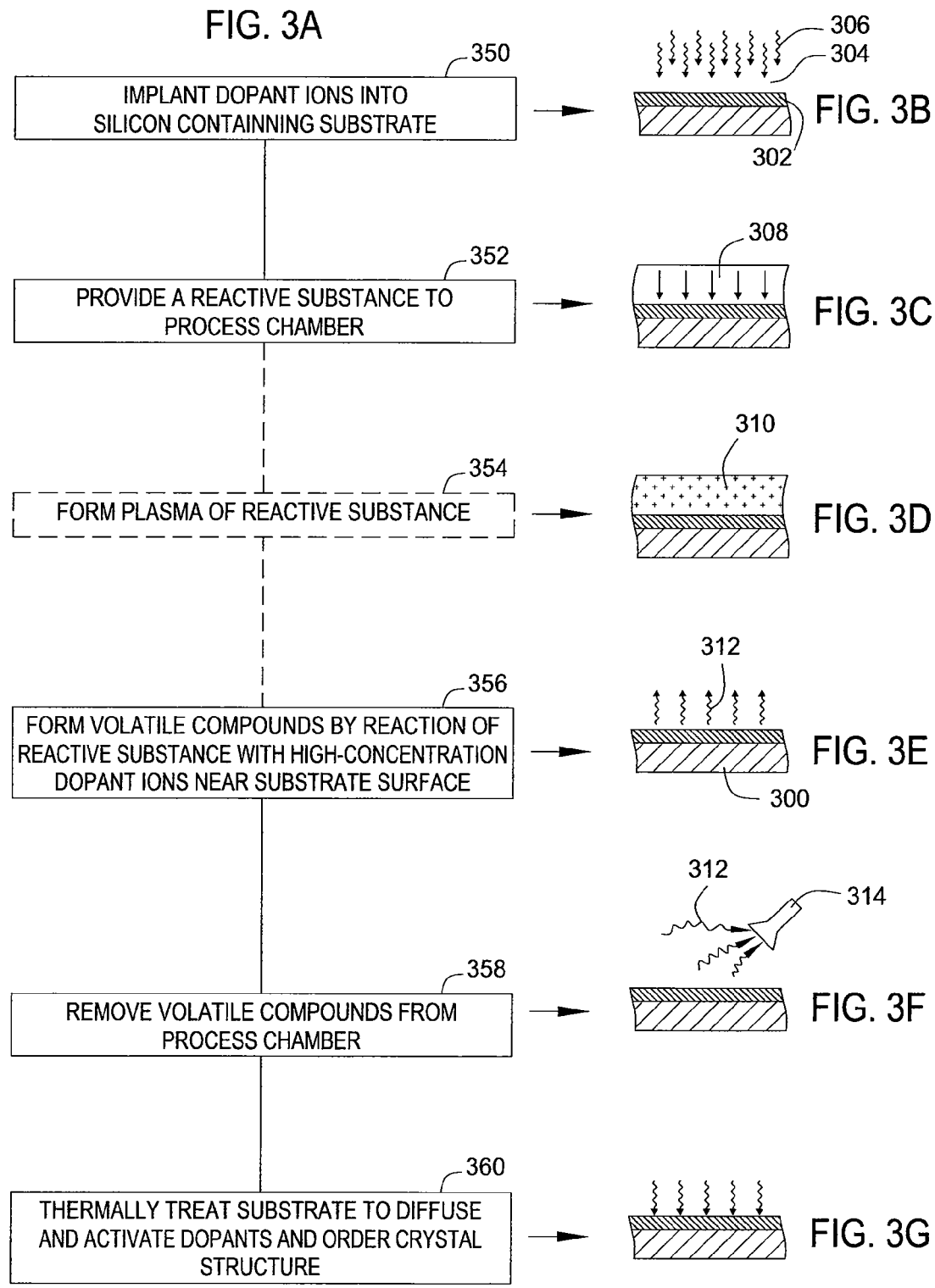

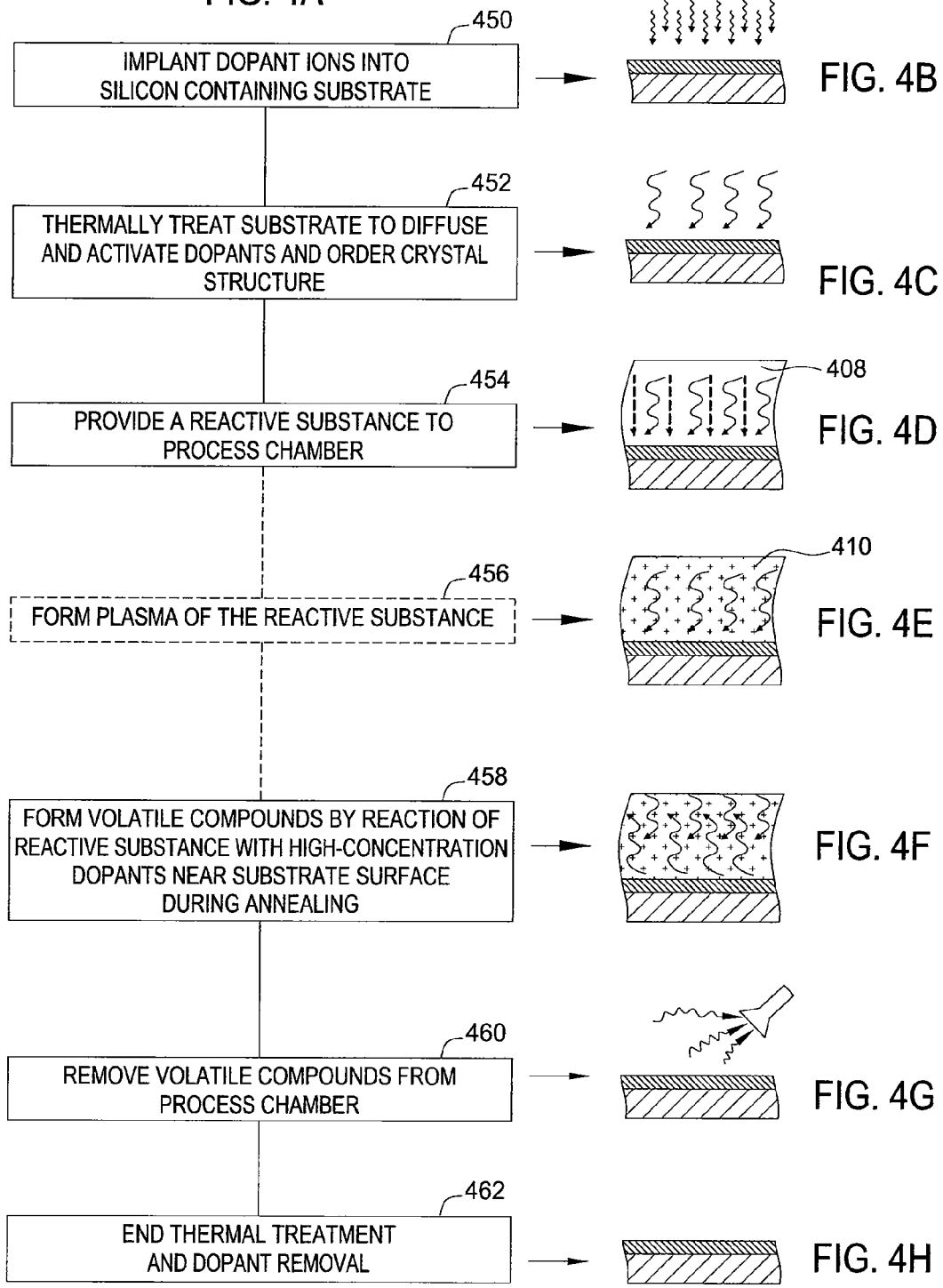

FIG. 5A

550 — IMPLANT DOPANT IONS INTO SILICON-CONTAINING SUBSTRATE → 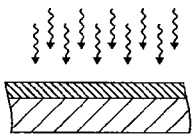 FIG. 5B

552 — THERMALLY TREAT SUBSTRATE AT A FIRST TEMPERATURE TO DIFFUSE AND ACTIVATE DOPANTS AND ORDER CRYSTAL → 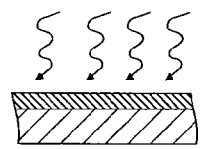 FIG. 5C 554 — CHANGE TEMPERATURE OF THERMAL TREATMENT → 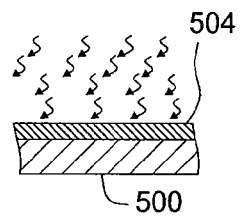 FIG. 5D 556 — PROVIDE A REACTIVE SUBSTANCE TO PROCESS CHAMBER → 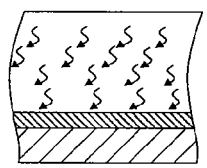 FIG. 5E 558 — FORM PLASMA OF THE REACTIVE SUBSTANCE → 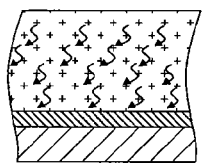 FIG. 5F 560 — FORM VOLATILE COMPOUNDS BY REACTION OF REACTIVE SUBSTANCE WITH HIGH-CONCENTRATION DOPANTS NEAR SUBSTRATE SURFACE → 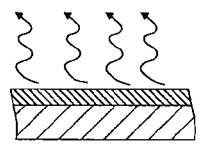 FIG. 5G 562 — REMOVE VOLATILE COMPOUNDS FROM PROCESS CHAMBER → 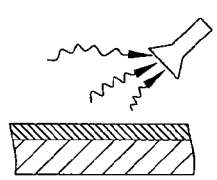 FIG. 5H

REMOVAL OF SURFACE DOPANTS FROM A SUBSTRATE

BACKGROUND OF THE INVENTION

1. Field of the Invention

Embodiments of the present invention generally relate to a method of manufacturing semiconductor devices. More specifically, embodiments of the present invention relate to methods of removing high-concentration dopants near the surface of a substrate.

2. Description of the Related Art

In semiconductor manufacturing processes, use of doping agents is often desired. Doping refers to any of a number of processes for implanting impurities into an otherwise substantially pure material. The impurities are desired for some property they impart to the doped composition or some change they effect in the properties of the composition. In some applications, dopants may provide an interface barrier to prevent diffusion of two materials into each other at an interface. For example, a surface of a dielectric material interfacing with a conductive layer in a film capacitor may be doped to prevent diffusion of conductive elements into the dielectric layer. In other applications, dopants may change thermal properties of a material. For example, dopants may be implanted in a material to be heat treated in order to change the thermal or optical properties of the material to facilitate the treatment. In a common application, dopants are distributed throughout a region of a substrate to form source and drain junctions for a transistor device. For example, dopants may be infused into a silicon crystal. The dopants have a different electronic configuration from the silicon, creating the potential for current flow through the crystal.

The process of infusing dopants into a material generally follows one of two paths. Dopants may be deposited on the surface of the material to be doped and then "driven-in" by heating the material to encourage the dopants to diffuse into the material. This process will usually involve forming a thermally conductive but robust capping layer over the dopant layer to prevent sublimation of the deposited dopant during heat treatment. Dopants will diffuse into the substrate material during heat treatment, resulting in a concentration gradient generally higher near the surface of the material and lower further into the material. The longer and more intense the heat treatment, the more the diffusion, and the flatter the concentration gradient. In processes involving implantation of dopants into a silicon crystal, this thermal treatment process also serves to "activate" the dopant atoms by encouraging them to occupy positions in the crystal lattice, and it increases order generally through the crystal lattice, reducing electrical resistivity due to crystal dislocations.

An alternate path involves energetic implantation of dopant ions into a substrate. In this process, dopants are ionized into a plasma, either remotely or in situ, and an electromagnetic field is used to accelerate the ions toward the substrate. The ions strike the surface of the substrate and burrow into the crystal structure. The depth each ion burrows into the crystal depends mostly on the kinetic energy of the ion. As in the "drive-in" embodiment above, the concentration distribution generally decreases monotonically with depth, and annealing is similarly done to diffuse and activate the dopants.

In each process, the region to be implanted with dopant may be "amorphized" prior to or during implantation. Amorphizing the region disrupts the crystal structure of the substrate, creating conduits for dopant atoms or ions to infiltrate the substrate. Amorphizing generally results in deeper implantation because dopants encounter fewer collisions near the surface than when implanted without amorphizing. This can be advantageous when deep implantation is desired.

Both processes result in the highest concentration of dopant remaining near the surface of the substrate. The former process frequently results in significant quantities of dopant being left on the surface of the substrate. In either case, after annealing, the substrate may be removed from the process chamber and placed into a storage box for a period of time. During that time, the substrate frequently degasses. In particular, the highly concentrated dopants near the surface of the substrate react with moisture in the air to form volatile compounds. Some of these are also highly toxic. For example, arsenic (As) and phosphorus (P), two widely used dopants, react with moisture in air to form arsine ($AsH_3$) and phosphine ($PH_3$), both of which are highly toxic. OSHA allowable exposure of arsine, for example, has recently been lowered from 50 parts-per-billion (ppb) to 5 ppb, due to its toxicity. Therefore, a method is needed for removing high concentrations of dopants from regions near the surface of a doped substrate.

SUMMARY OF THE INVENTION

Embodiments of the present invention generally provide a method of treating a substrate containing dopants comprising disposing the substrate in one or more chambers; providing a dopant removal mixture to the one or more chambers; producing one or more volatile compounds in at least one of the chambers by applying the dopant removal mixture to the substrate; and removing the one or more volatile compounds from the one or more chambers.

Other embodiments provide a method of annealing a doped substrate in one or more chambers comprising providing one or more dopant removal mixtures to at least one of the chambers; forming one or more plasmas of the dopant removal mixture; exposing the doped substrate to the one or more plasmas; producing one or more volatile compounds in the one or more chambers by applying the one or more plasmas to the substrate; and removing the one or more volatile compounds from the one or more chambers.

Further embodiments provide a process for treating a silicon-containing substrate in one or more process chambers comprising depositing a layer of dopants on at least a portion of a surface of the substrate; forming a capping layer over at least a portion of the dopant layer; thermally treating the substrate to diffuse the dopants into the substrate and activate them; providing a reactive etchant to at least one of the process chambesr; removing the capping layer from the dopant layer; forming one or more volatile compounds by reacting the etchant with dopants; and removing the one or more volatile compounds from the one or more process chambers.

Other embodiments provide a method of removing high-concentration dopants from a surface region of a substrate, comprising exposing the surface region to a reactive gas mixture, forming one or more volatile compounds by reacting the gas mixture with dopants in or on the surface region, and removing the one or more volatile compounds from the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be

FIG. 2A is a process flow diagram according to one embodiment of the invention.

FIGS. 2B-2I illustrate one sequence for a substrate modified by the process flow diagram of FIG. 2A.

FIG. 3A is a process flow diagram according to another embodiment of the invention.

FIGS. 3B-3G illustrate one sequence for a substrate modified by the process flow diagram of FIG. 3A.

FIG. 4A is a process flow diagram according to another embodiment of the invention.

FIGS. 4B-4H illustrate one sequence for a substrate modified by the process flow diagram of FIG. 4A.

FIG. 5A is a process flow diagram according to another embodiment of the invention.

FIGS. 5B-5H illustrate one sequence for a substrate modified by the process flow diagram of FIG. 5A.

DETAILED DESCRIPTION

Embodiments of the invention generally provide methods and apparatus for removing dopants from regions near the surface of a doped substrate. It has been discovered that dopants may be readily removed by exposing the substrate, in one or more process chambers, to materials that form volatile compounds from the dopants. The volatile compounds may then be removed from the one or more process chambers. The dopant stripping may be performed with or without plasma at any point after deposition or implanting of dopants, or annealing. Embodiments are described in which dopants deposited on the surface of a substrate during a "drive-in" implantation process are removed from a process chamber by first etching away a capping layer and then reacting the remaining dopants with a dopant removal mixture, such as hydrogen ($H_2$), nitrogen ($N_2$), oxygen ($O_2$), ammonia ($NH_3$), nitrogen trifluoride ($NF_3$), silicon tetrafluoride ($SiF_4$), humid air, or combinations thereof, optionally including a remote or in situ plasma generated by capacitive or inductive coupling.

Volatile compounds such as arsine ($AsH_3$), phosphine ($PH_3$), boranes ($B_xH_{3x}$), and borazine ($B_3H_6N_3$) are formed and removed from the process chamber. Other embodiments will be described in which the dopant removal is accomplished before, during, and after thermal treatment. Still other embodiments will be described featuring plasma ion implantation followed by dopant removal. Finally, embodiments will be described in which dopant removal is accomplished in multiple chambers.

Figure 1A:
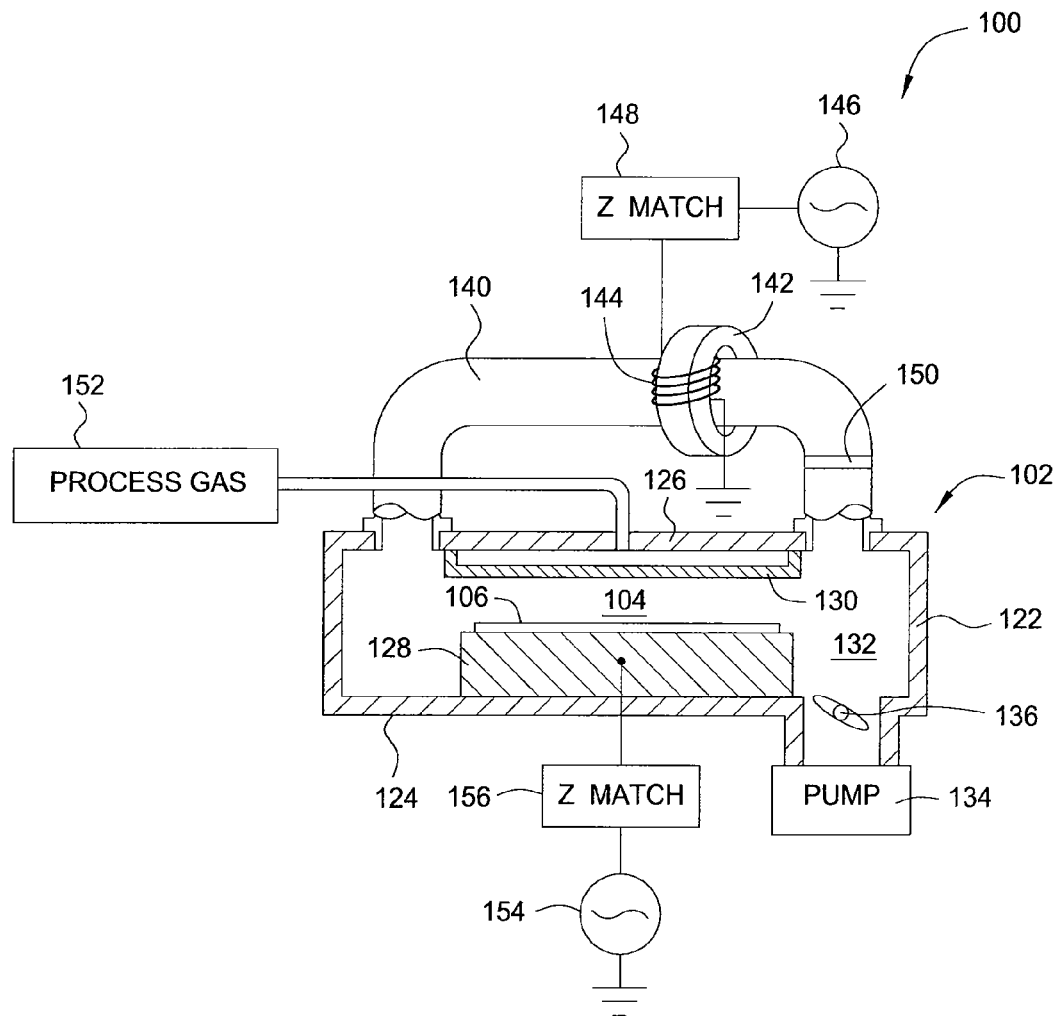
FIG. 1A is a schematic cross-section diagram of an apparatus according to one embodiment of the invention.

FIG. 1A is a schematic cross-section diagram of an apparatus according to one embodiment of the invention. The apparatus illustrated is configured to perform plasma-assisted processes such as plasma implantation of dopants in a substrate. The plasma reactor 100 includes a chamber body 102 having a bottom 124, a top 126, and side walls 122 enclosing a process region 104. A substrate support assembly 128 is supported from the bottom 124 of the chamber body 102 and is adapted to receive a substrate 106 for processing. A gas distribution plate 130 is coupled to the top 126 of the chamber body 102 facing the substrate support assembly 128. A pumping port 132 is defined in the chamber body 102 and coupled to a vacuum pump 134. The vacuum pump 134 is coupled through a throttle valve 136 to the pumping port 132. A gas source 152 is coupled to the gas distribution plate 130 to supply gaseous precursor compounds for processes performed on the substrate 106.

Figure 1B:
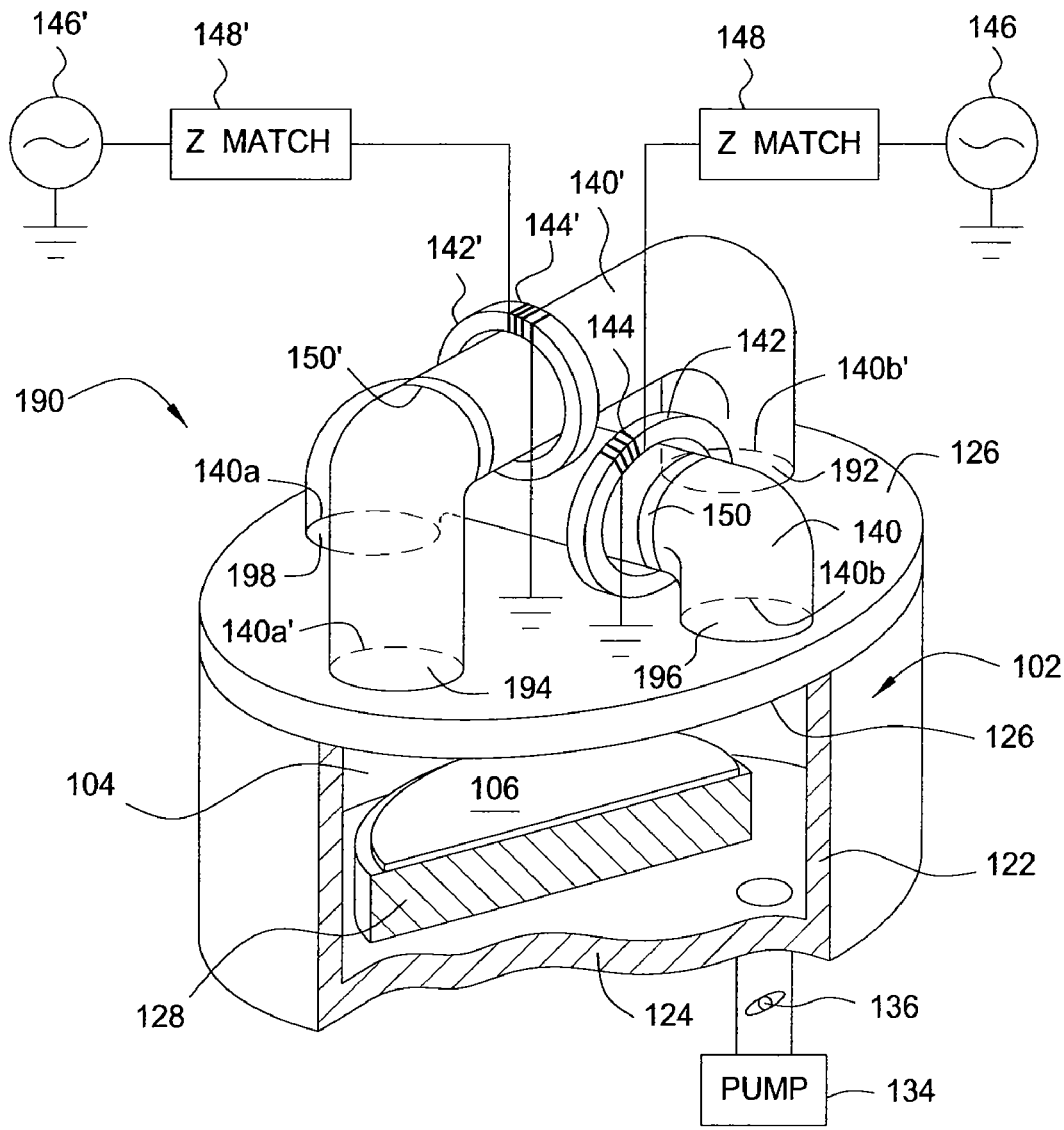
FIG. 1B is a perspective view of the plasma source for FIG. 1A.

The reactor 100 depicted in FIG. 1A further includes a plasma source 190 best shown in the perspective view of FIG. 1B. The plasma source 190 includes a pair of separate external reentrant conduits 140, 140' mounted on the outside of the top 126 of the chamber body 102 disposed transverse to one another (or orthogonal to one another, as shown in the exemplary embodiment depicted in FIG. 1B). The first external conduit 140 has a first end 140a coupled through an opening 198 formed in the top 126 into a first side of the process region 104 in the chamber body 102. A second end 140b has an opening 196 coupled into a second side of the process region 104. The second external reentrant conduit 140b has a first end 140a' having an opening 194 coupled into a third side of the process region 104 and a second end 140b' having an opening 192 into a fourth side of the process region 104. In one embodiment, the first and second external reentrant conduits 140, 140' are configured to be orthogonal to one another, thereby providing the two ends 140a, 140a', 140b. 140b' of each external reentrant conduits 140, 140' disposed at about 90 degree intervals around the periphery of the top 126 of the chamber body 102. The orthogonal configuration of the external reentrant conduits 140, 140' allows a plasma source distributed uniformly across the process region 104. It is contemplated that the first and second external reentrant conduits 140, 140' may be configured as other distributions utilized to provide uniform plasma distribution into the process region 104.

Magnetically permeable torroidal cores 142, 142' surround a portion of a corresponding one of the external reentrant conduits 140, 140'. The conductive coils 144, 144' are coupled to respective RF plasma source power generators 146, 146' through respective impedance match circuits or elements 148, 148'. Each external reentrant conduit 140, 140' is a hollow conductive tube interrupted by an insulating annular ring 150, 150' respectively that interrupts an otherwise continuous electrical path between the two ends 140a, 140b (and 140a', 104b') of the respective external reentrant conduits 140, 140'. Ion energy at the substrate surface is controlled by an RF plasma bias power generator 154 coupled to the substrate support assembly 128 through an impedance match circuit or element 156.

Referring back to FIG. 1A, process gases including gaseous compounds supplied from the process gas source 152 are introduced through the overhead gas distribution plate 130 into the process region 104. RF source plasma power 146 is coupled to gases supplied in the conduit 140 by conductive coil 144 and torroidal core 142, creating a circulating plasma current in a first closed torroidal path including the external reentrant conduit 140 and the process region 104. Also, RF source power 146' may be coupled to gases in the second conduit 140' by conductive coil 144' and torroidal core 142', creating a circulating plasma current in a second closed torroidal path transverse (e.g., orthogonal) to the first torroidal path. The second torroidal path includes the second external reentrant conduit 140' and the process region 104. The plasma currents in each of the paths oscillate (e.g., reverse direction) at the frequencies of the respective RF source power generators 146, 146', which may be the same or slightly offset from one another.

In one embodiment, the process gas source 152 provides different process gases that may be utilized to provide ions implanted to the substrate 106. Suitable examples of process gases include $B_2H_6$, $BF_3$, $SiH_4$, $SiF_4$, $PH_3$, $P_2H_5$, $PO_3$, $PF_3$, $PF_5$ and $CF_4$, among others. The power of each plasma source power generators 146, 146' is operated so that their combined effect efficiently dissociates the process gases supplied from the process gas source 152 and produces a desired ion flux at the surface of the substrate 106. The power of the RF plasma bias power generator 154 is controlled at a selected level at which the ion energy dissociated from the process gases may be accelerated toward the substrate surface and implanted at a desired depth below the top surface of the substrate 106 with desired ion concentration, or deposited on the surface of substrate 106. For example, with relatively low RF power applied to bias generator 154, such as less than about 50 eV, relatively low plasma ion energy may be obtained. Dissociated ions with low ion energy may be implanted at a shallow depth between about 0 Å and about 100 Å from the substrate surface, or merely deposited on the surface of substrate 106. Alternatively, dissociated ions with high ion energy provided and generated from high RF power, such as higher than about 50 eV, may be implanted into the substrate having a depth substantially over 100 Å depth from the substrate surface.

Bias power generator 154 is shown coupled to substrate support 128 through matching network 156, with showerhead 130 grounded. Bias power generator 154 applies a monopolar RF-driven electrical bias to plasma generated by tubes 140 and 140'. In alternate embodiments, bias power generator 154 may be coupled to showerhead 130, or separate bias circuits may be independently coupled to both showerhead 130 and substrate support 128.

The combination of the controlled RF plasma source power and RF plasma bias power dissociates ions in the gas mixture having sufficient momentum and desired ion distribution in the plasma reactor 100. The ions are biased and driven toward the substrate surface, thereby implanting ions into the substrate with desired ion concentration, distribution and depth from the substrate surface, if sufficiently energized. Lower energy plasma bias power may result in deposition on the surface of the substrate with little penetration. Furthermore, the controlled ion energy and different types of ion species from the supplied process gases facilitates ions implanted in the substrate 106, forming desired device structure, such as gate structure and source drain region on the substrate 106.

Plasma reactor 100 may further comprise a chamber liner (not shown). Chamber liners are commonly provided to protect chamber walls from reactive components during processing. Such liners may be made of ceramic, silicon, or other protective materials, and may be designed to be replaced periodically. In alternate embodiments, the chamber may be chemically lined by depositing a silicon or oxide layer on the inside surface of the chamber prior to processing. An in-situ chamber liner of this sort serves the same function, and may be removed and replaced by etching or cleaning processes.

FIG. 2A illustrates a process according to one embodiment of the invention. FIGS. 2B-2I illustrate a substrate modified by the process of FIG. 2A. One embodiment begins with deposition of a layer of dopant atoms on a surface of a silicon-containing substrate, as in step 250. Dopant atoms generally used in forming source drain regions of transistors include boron (B), phosphorus (P), arsenic (As), germanium (Ge), and silicon (Si), but need not be limited to these. Nitrogen (N), carbon (C), oxygen (O), helium (He), xenon (Xe), argon (Ar), fluorine (Fl), and chlorine (Cl) are also frequently implanted into substrates for other needs. The processes described herein as embodiments of the invention may be used to remove any suitable dopant with minimal modification. In a deposition-first process, dopant layer 202 may be up to about 100 Angstroms, preferably up to about 50 Angstroms, in depth. FIG. 2B illustrates substrate 200, with dopant layer 202 deposited thereon.

In a deposition-first process, the dopant layer is thermally treated, as in step 254, to encourage diffusion into substrate 200. To avoid sublimation of dopant layer 202 during thermal treatment, capping layer 204 may be formed over dopant layer 202, as shown in step 252 and FIG. 2C. Capping layer 204 is not required for all embodiments, but if used, capping layer 204 may be formed of silicon, oxygen, carbon, nitrogen, hydrogen, metal, or any suitable combination thereof. The capping layer 204 need only be thermally conductive and stable up to annealing temperatures approaching the melting point of silicon (about 1410° C.). Examples of capping layers commonly used are silicon nitride ($Si_aN_b$), silicon carbide ($Si_aC_c$), silicon oxynitrides ($Si_aO_dN_b$), silicon oxides ($Si_aO_d$), and metal nitrides ($M_eN_f$), wherein the metal may be any commonly used barrier or capping metal, such as titanium (Ti), tantalum (Ta), or tungsten (W). Such layers may be deposited by physical or chemical vapor deposition with or without plasma and are generally not stoichimetric combinations of elements. For example, in the above compounds, if a=1, b may range from about 0.3 to about 1.5, c may range from about 0.3 to about 1.2, and d may range from about 0.5 to about 2.5. Also, if e=1, f may range from about 0.8 to about 1.2.

Thermal treatment in step 254 drives dopant atoms from layer 202 into substrate 200. FIG. 2D illustrates dopant atoms distributed throughout substrate 200 to formed doped layer 206, capping layer 204 over all, with surface dopant layer 202 having disappeared. Dopants in doped layer 206 will be higher in concentration near the surface of substrate 200. It should be noted that in many cases dopant layer 202 may not be consumed during the drive-in process, but may survive as a 10-100 Angstrom layer of dopant atoms remaining between doped layer 206 of substrate 200 and capping layer 204. In step 254, thermal treatment may comprise any temperature history suitable to diffuse and activate the dopants deposited on the substrate. Any combination of heating, cooling, rapid, spike, impulse, laser, or flash annealing may suffice to cause the desired diffusion. In the case of laser annealing, the capping layer may be an anti-reflective layer or an absorber layer to assist in the annealing process.

In step 256, a reactive mixture may be provided to the process chamber. The reactive mixture may comprise substances such as hydrogen ($H_2$), oxygen ($O_2$), nitrogen ($N_2$), ammonia ($NH_3$), nitrogen trifluoride ($NF_3$), silicon tetrafluoride ($SiF_4$), or dihydrogen sulfide ($H_2S$). FIG. 2E illustrates an embodiment in which reactive mixture 210 impinges first on capping layer 204. Reactive mixture 210 is selected, in this embodiment, to react first with capping layer 204 to remove it, and then with dopants in doped layer 206 of substrate 200. As such, reactive mixture 210 is not necessarily limited to the substances listed above.

It may be advantageous to form a plasma of reactive mixture 210, as shown in optional step 258. FIG. 2F illustrates that reactive mixture 210 has been ionized into plasma 212. In some embodiments, it may be helpful to use a plasma to remove both capping layer 204 and dopants near the surface of doped layer 206. Plasma may be generated remotely or in situ by capacitative or inductive coupling. An etchant such as hydrogen fluoride (HF) may be used for this purpose. In step 260, capping layer 204 is etched away from substrate 200 by plasma 212.

In step 262, the etchant used to etch away the capping layer reacts with dopant atoms at or just below the surface of doped layer 206 of substrate 200 to form volatile compounds. Such compounds may include arsine ($AsH_3$), phosphine ($PH_3$), borane ($BH_3$), diborane ($B_2H_6$), borazine ($B_3N_3H_6$), and boron halides ($BX_3$ or $B_2X_4$). Depending on the type of dopant, an etchant should be selected to react with the dopant to form one or more volatile compounds. Volatile compounds 214 evolve from substrate 200 in FIG. 2H and are removed by vacuum in FIG. 2I. Dopant is preferably removed up to about 10 Angstroms below the surface of the substrate, but longer exposure to the reactive mixture may remove dopant deeper in the substrate, such as up to about 30 Angstroms below the surface of the substrate. In this embodiment, a single reactive mixture is illustrated. It should be noted however, that the mixture used to remove the capping layer may be different from that used to remove dopants.

It is generally advantageous to apply thermal control to a substrate undergoing dopant removal. Somewhat elevated temperature may be helpful to encourage volatile compounds to leave the substrate. A controlled substrate temperature greater than about 50° C. will be desired in some embodiments for this purpose.

A protective oxide layer may be formed over the substrate at the end of the treatment. This protective layer minimizes any further changes to the composition of the substrate beneath the layer. In some embodiments, the oxide layer may be a native oxide layer generated by exposing the substrate to air. In other embodiments, an oxidizing agent, with or without plasma, may be provided to the process chamber to generate an oxide layer up to about 40 Angstroms thick. The oxide layer prevents any further dopants from migrating to the surface of the substrate and reacting with air or moisture, and it prevents any unwanted adsorption of contaminants on the surface.

According to this embodiment, a substrate of dimension between about 200 millimeter (mm) to about 450 mm, such as about 300 mm, may be disposed in a process chamber. The substrate may be a silicon-containing substrate, for example a polysilicon substrate. The substrate may also be an amorphous silicon substrate. Boron dopant may be deposited on the surface of the substrate by chemical or physical vapor deposition, with or without plasma assistance. For example, a gas mixture comprising diborane and a carrier gas may be provided to a deposition chamber. Composition of the gas mixture may be from about 5% to about 10% diborane by weight, with the rest comprising hydrogen gas ($H_2$), helium (He), or a combination thereof. The gas mixture may be provided at a flowrate between about 20 standard cubic centimeters per minute (sccm) and about 300 sccm. A supplemental diluent gas comprising hydrogen gas ($H_2$), helium (He), argon (Ar), or combinations thereof, may also be provided at a flow rate of between about 10 sccm and about 200 sccm. The chamber temperature is generally maintained between about 5° C. and about 70° C. Plasma may be generated by providing power up to about 6 kilowatts (kW) to inductive sources 142 and 142' described above, and the plasma may be biased by applying RF power between about 100 watts (W) and about 5 kW to substrate support 128 using bias power supply 154 and coupling described above. Processing for about 3 seconds (sec) to about 200 sec will generally yield a boron dopant layer up to about 300 Angstroms thick on the surface of the substrate.

Following an anneal at 1300° C. for up to about 10 seconds, ammonia ($NH_3$) may be provided to the process chamber at a flow rate of about 10 to about 200 sccm for approximately 3 sec to about 200 sec. The substrate temperature is generally reduced following anneal to a temperature less than about 100° C. A plasma may be generated by applying RF power at a frequency of about 13.56 MHz to generate an electric field to ionize the ammonia. Activated ammonia ions react with boron dopant on and just below the surface of the substrate. In one embodiment, excess boron dopant on, and within about 10 Angstroms of, the surface of the substrate is converted to borazine ($B_3H_6N_3$), which is a volatile compound. Finally, oxygen ($O_2$) may be added to the gas mixture for about 30 seconds to form a protective oxide layer up to about 40 Angstroms thick over the substrate after dopant removal. The protective oxide layer may prevent further evolution of dopants from the stripped surface of the substrate.

In an alternative embodiment, dopants may be energetically implanted, rather than deposited on the surface. As discussed above, such implantation involves ionizing dopant atoms and accelerating them toward the substrate using an electromagnetic field, as practiced using the Plasma Ion Immersion Implantation (P3I) process implemented using the CENTURA™ chamber available from Applied Materials of Santa Clara, Calif. In an alternate embodiment, energetic implantation may be achieved using the QUANTUM X PLUS™ ion beam implanter available from Applied Materials of Santa Clara, Calif. As device geometry grows smaller, implant regions become thinner, in some current applications approaching 100 Angstroms. As implant regions grow thinner, the energy needed for ions to burrow into the crystal becomes less, and must be limited to avoid over-implantation. Due to spatial variations in energy density of the ionization field and the accelerating electromagnetic field, dopant ions have a distribution of energies. Higher energy ions implant deeply, whereas low energy ions may only adsorb onto the surface of the substrate. FIG. 3B illustrates this phenomenon. Ions 306 are accelerated toward substrate 300 in implantation step 350. Some implant deeply to form doped layer 302 in substrate 300, and some adsorb onto the surface, 304.

Following implantation, the excess dopant adsorbed onto the surface and high-concentration dopant immediately below the surface may be removed prior to annealing. A reactive mixture or substance, 308 in FIG. 3C, may be provided to the process chamber, as in step 352. The mixture may comprise hydrogen ($H_2$), oxygen ($O_2$), nitrogen ($N_2$), ammonia ($NH_3$), nitrogen trifluoride ($NF_3$), silicon tetrafluoride ($SiF_4$), dihydrogen sulfide ($H_2S$), and other gases selected to react with dopant atoms to form volatile compounds. The reactive mixture may optionally be ionized into a plasma, step 354 and plasma 310 in FIG. 3D. the reactive mixture bonds with dopant atoms in step 356 to form one or more volatile compounds, 312 in FIG. 3E, which evolve from the substrate. The layer of dopant adsorbed onto the surface of substrate 300 is removed, as is high-concentration dopant near the surface of substrate 300, and volatile compounds produced 312 are removed from the process chamber by vacuum 314 in step 358 and FIG. 3F. Thereafter, dopant remaining in substrate 300 must be distributed by diffusion and activated, so substrate 300 is thermally treated in step 360 to accomplish this.

According to this embodiment, a substrate of dimensions between about 200 mm and about 450 mm, such as about 300 mm, may be disposed in a process chamber. The substrate may be a silicon-containing substrate, for example a polysilicon or amorphous silicon substrate. Phosphorus dopant may be implanted into the substrate by Plasma Ion Immersion Implantation. For example, a gas mixture comprising from about 5% to about 10% phosphine ($PH_3$) by weight, with the rest comprising $H_2$, He, or a combination thereof, may be provided to the process chamber at a flow rate of about 3 sccm to about 200 sccm. A plasma may be generated by providing power up to about 6 kW to the inductively coupled source described above. Phosphorus ions subjected to plasma conditions dissociate from the phosphine gas, and may be directed toward the substrate by applying an electrical bias to the showerhead using RF power of about 100 W to about 5 kW. Processing for about 3 sec to about 200 sec will implant phosphorus ions up to about 300 Angstroms below the surface of the substrate. As described above, in some embodiments concentration of implanted phosphorus ions will be greatest at or near the surface of the substrate. Hydrogen may be added to the plasma at a flowrate of about 20 sccm to about 300 sccm for about 3 sec to about 200 sec and ionized to react with the deposited phosphorus on the surface of the substrate and up to about 20 Angstroms below the surface. The reaction regenerates phosphine gas ($PH_3$), which is removed from the chamber. Add hydrogen during processing minimizes deposition of dopants on the surface of the substrate. The substrate may then be annealed to activate the remaining dopant, and may briefly be exposed to an oxidizing gas, such as oxygen ($O_2$) or steam ($H_2O$) to generate a protective oxide layer.

In other embodiments, excess dopant may be removed at the same time as thermal treatment of the substrate. FIG. 4A is a process flow diagram, according to one embodiment of the invention, that features providing the reactive substance 408 to the process chamber, step 454, between the start of thermal treatment in step 452 and the end of thermal treatment in step 462. Depending on dopants to be removed, plasma 410 may optionally be used in step 456. Reactive components form volatile compounds by reacting with dopants in step 458, and are removed by vacuum 414 in step 460. This embodiment allows diffusion and activation to proceed coincident with excess dopant removal so that extra steps and extra processing time are not required.

According to this embodiment, a substrate of dimensions between about 200 mm and about 450 mm, such as about 300 mm, may be disposed in a process chamber. The substrate may be a silicon-containing substrate, for example a polysilicon or amorphous silicon substrate. Arsenic dopant may be implanted into the substrate by Plasma Ion Immersion Implantation. For example, a gas mixture comprising from about 5% to about 10% arsine ($AsH_3$) by weight, with the rest comprising $H_2$, He, or a combination thereof, may be provided to the process chamber at a flow rate of about 3 sccm to about 200 sccm. A plasma may be generated by providing power up to about 6 kW to the inductively coupled source described above. Arsenic ions subjected to plasma conditions dissociate from the arsine gas, and may be directed toward the substrate by applying an electrical bias to the showerhead using RF power of about 100 W to about 5 kW. Processing for about 3 sec to about 200 sec will implant arsenic ions up to about 300 Angstroms below the surface of the substrate. As described above, in some embodiments concentration of implanted ions will be greatest at or near the surface of the substrate.

The substrate may then be annealed at about 1300° C. for up to about 10 sec. During the anneal process, hydrogen may added to the chamber at a flowrate of about 20 sccm to about 300 sccm for about 3 sec to about 200 sec to react with the deposited arsenic on the surface of the substrate and up to about 20 Angstroms below the surface. The reaction regenerates arsine gas ($PH_3$), which is removed from the chamber while annealing proceeds. The substrate may then be briefly exposed to an oxidizing gas, such as oxygen ($O_2$) or steam ($H_2O$) to generate a protective oxide layer.

In still other embodiments, excess dopant may be removed after thermal treatment of the substrate. FIG. 5A is a process flow diagram illustrating this embodiment. In this embodiment, thermal treatment of the substrate is carried out in step 552. FIG. 5D illustrates the compressive effect of thermal treatment 552 on adsorbed dopant layer 504. As thermal treatment progresses, the dopant layer 504 originally adsorbed onto the surface of substrate 500 is compressed by partial diffusion into substrate 500 and by sublimation into vapor to leave a much thinner excess layer. Excess dopant removal may be carried out at a different temperature than thermal treatment, as shown by step 554. For example, it may be advantageous to perform dopant removal at a temperature lower than the thermal treatment temperature, such as a temperature less than about 200° C. Lower temperatures stop diffusion processes in the substrate, thus providing a very thin surface layer of substantially dopant-free silicon.

The foregoing processes may be performed in other ways. For example, in some embodiments the treatments described above may be performed in multiple chambers. In embodiments wherein the dopant removal is performed after dopant deposition or implantation, the dopant removal process may be performed in a separate process chamber from the implantation or deposition process. The substrate may be removed from the implant or deposition chamber by a transfer device housed in a transfer chamber and transported to a different chamber, such as a thermal treatment chamber or other suitable apparatus, for dopant removal. Likewise, dopant removal processes may be performed in multiple steps using multiple chambers. A first process chamber may remove a portion of the dopant, and subsequent chambers may remove further increments of dopant. Plasma and heat may be used in one, many, or all such chambers. Furthermore, the one or more chambers in which dopant removal is accomplished may include a ventilated box. Substrates with dopants may be transported to the ventilated box and exposed to a dopant removal mixture such as humid air to generate volatile gases.

While the foregoing is directed to embodiments of the present invention, other and further embodiments of the invention may be devised without departing from the basic scope thereof, and the scope thereof is determined by the claims that follow.

The invention claimed is:

1. A process for treating a silicon-containing substrate in a process chamber, comprising:
   depositing a layer of dopants on at least a portion of a surface of the substrate;
   forming a capping layer over at least a portion of the dopant layer;
   thermally treating the substrate to diffuse the dopants into the substrate and activate the dopants;
   providing a reactive etchant to the process chamber;
   removing the capping layer from the dopant layer;
   forming one or more volatile compounds by reacting the etchant with dopants, wherein the one or more volatile compounds comprise arsine ($AsH_3$), phosphine ($PH_3$), borane ($BH_3$), diborane ($B_2H_6$), borazine ($B_3H_6N_3$), combinations thereof, or derivatives thereof; and
   removing the one or more volatile compounds from the process chamber.

2. The process of claim 1, wherein the dopants comprise boron (B), arsenic (As), phosphorus (P), or combinations thereof.

3. The process of claim 1, wherein the capping layer comprises silicon, oxygen, carbon, nitrogen, metal, or combinations thereof.

4. The process of claim 1, wherein the capping layer is an anti-reflective coating.

5. The process of claim 1, wherein the etchant comprises nitrogen trifluoride ($NF_3$), silicon tetrafluoride ($SiF_4$), or combinations thereof.

6. The process of claim 1, further comprising forming a plasma of the reactive etchant.

7. The process of claim 6, wherein the plasma is a remote plasma.

8. The process of claim 6, wherein the plasma is inductively coupled.

9. The process of claim 1, wherein the reactive etchant comprises hydrogen ($H_2$), nitrogen ($N_2$), oxygen ($O_2$), ammonia ($NH_3$), nitrogen trifluoride ($NF_3$), silicon tetrafluoride ($SiF_4$), air, or combinations thereof.

10. The process of claim 1, wherein, during the forming the one or more volatile compounds, the substrate is thermally controlled at a first temperature selected to encourage the one or more volatile compounds to evaporate from the substrate.

11. The process of claim 10, wherein the first temperature is at least about 50° C.

12. The process of claim 10, wherein thermally treating the substrate to diffuse the dopants into the substrate and activate the dopants is performed at a second temperature different from the first temperature.

* * * * *